United States Patent [19]

Kaplan

[11] 4,321,648
[45] Mar. 23, 1982

[54] OVER-CURRENT PROTECTION CIRCUITS FOR POWER TRANSISTORS

[75] Inventor: Leonard A. Kaplan, Fords, N.J.

[73] Assignee: RCA Corporation, New York, N.Y.

[21] Appl. No.: 237,872

[22] Filed: Feb. 25, 1981

[51] Int. Cl.³ .............................................. H02H 9/02
[52] U.S. Cl. ................................. 361/101; 330/207 P
[58] Field of Search .............................. 361/100, 101; 330/207 P, 298

[56] References Cited

U.S. PATENT DOCUMENTS

| | | | |
|---|---|---|---|
| 3,668,545 | 6/1972 | Von Recklinghausen | 330/207 P |
| 3,792,316 | 2/1974 | Bondini et al. | 361/79 |
| 3,845,405 | 10/1974 | Leidich | 330/207 P |
| 3,967,207 | 6/1976 | Wheatley, Jr. | 330/207 P X |
| 4,058,775 | 11/1977 | Crowle | 330/207 P X |
| 4,074,334 | 2/1978 | D'Arrigio et al. | 330/207 P X |
| 4,078,207 | 3/1978 | Leidich | 330/207 P X |
| 4,157,513 | 6/1979 | Ghiringhelli et al. | 330/207 P X |
| 4,225,897 | 9/1980 | Kaplan | 330/207 P X |

OTHER PUBLICATIONS

D. Rawson-Harris, "Variable Current-Limiting Supply", Wireless World, Jan. 1980, p. 73.

R. Dobkin, "IC with Load Protection Simulates Power Transistor", Electronics, Feb. 7, 1974, pp. 119-123.
Data Sheet, CA 2002, RCA Linear Integrated Circuits, RCA Solid State, Nov. 1978, pp. 314-315.

*Primary Examiner*—Reinhard J. Eisenzopf
*Attorney, Agent, or Firm*—Eugene M. Whitacre; Paul J. Rasmussen; Clement A. Berard, Jr.

[57] ABSTRACT

A protected transistor in an electronic circuit receives base drive current and has its collector-emitter path coupled to a source of collector-emitter potential and to a load. Overcurrent protection therefor is provided by a first, complementary conductivity type transistor connected base to emitter and emitter to base with the protected transistor, and thermally coupled thereto, to develop a collector current responsive to the collector-emitter current of the protected transistor. A comparator provides an overcurrent indication whenever the collector current of the first transistor exceeds a predetermined level. The overcurrent indication prevents further increase in the base drive current to the protected transistor. A further feature of the invention reduces the predetermined level in response to increasing collector-emitter potential of the protected transistor.

20 Claims, 1 Drawing Figure

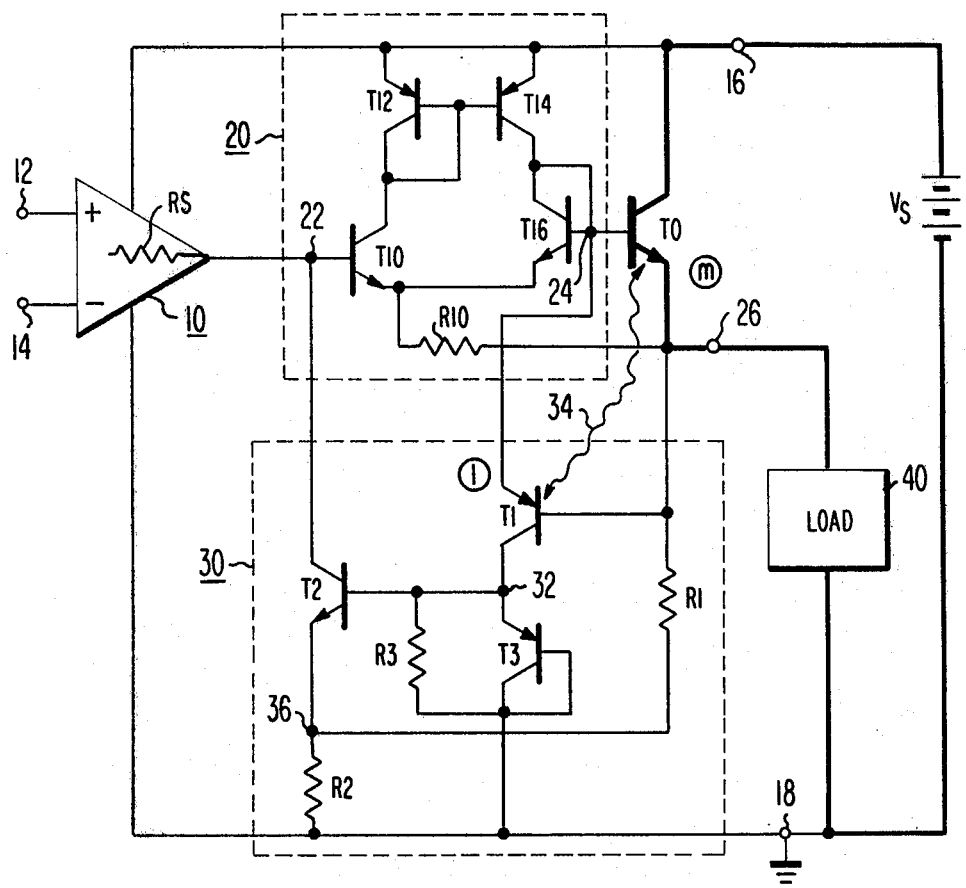

OVER-CURRENT PROTECTION CIRCUITS FOR POWER TRANSISTORS

This invention relates generally to overcurrent protection circuits for protecting power transistors and, in particular, to protection circuits without resistive current sensing.

Current sensing for overcurrent protection is commonly achieved by inserting a current sensing element, for example, a resistor, in series with the main current-conduction path of the protected transistor. Because the voltage drop across that resistor is directly proportional to transistor current, a simple voltage comparator can be employed to detect excessive current and to halt further increase in base drive current to the protected transistor when the overcurrent condition exists. In addition to the disadvantage of dissipating substantial power in the sensing resistor, the approach just described also undesirably reduces the portion of available supply potential which can be developed across the load of the protected transistor.

The present invention avoids the undesirable effects associated with a current sensing resistor in an electronic circuit including a protected transistor of first conductivity type to which base drive current is applied and the collector-emitter current path of which is coupled to a load and to a source of voltage for developing a potential across the collector-emitter path. In the present invention an overcurrent protection circuit for the protected transistor comprises a first transistor of second conductivity type complementary to the first conductivity type, the base and emitter electrodes of which respectively connect to the emitter and base electrodes of the protected transistor without substantial intervening impedance through which collector-emitter current of the protected transistor flows. The protected transistor is thermally coupled with the first transistor for tracking its operating temperature. A comparator provides an indication of overcurrent condition with respect to the protected transistor whenever collector current of the first transistor exceeds a predetermined level. The overcurrent indication is applied to prevent further increase in the base drive current to the protected transistor.

The drawing includes a sole FIGURE which is a schematic diagram of an amplifier circuit including an embodiment of the present invention.

In the amplifier of the FIGURE, input amplifier 10 receives input signals between non-inverting input terminal 12 and inverting input terminal 14 and supplies a signal responsive thereto to drive circuit 20 at node 22. Drive circuit 20 applies base drive current from node 24 to the base of NPN output transistor T0 for which overcurrent protection is desired. The collector-emitter current path of transistor T0 is coupled via output terminal 26 to load 40 which can be, for example, a loudspeaker in an automobile radio. Transistor T0 and load 40 are coupled to a source of collector-emitter potential, shown by way of example as battery VS, connected between relatively positive supply terminal 16 and relatively negative supply terminal 18, which can be connected to ground. Load current flows through the circuit path indicated by the heavy lines connecting T0, VS, and load 40. Protection circuit 30 responds to the collector-emitter current in protected transistor T0 in a manner to be described presently to provide an indication of overcurrent condition with respect to T0 and to apply signal responsive to the overcurrent indication to node 22 to prevent further increase in the base drive current to T0.

Amplifier 10 is a representative amplifier, the configuration of which is not critical to the present invention. One such amplifier is that incorporated in the RCA CA2002 Integrated Circuit 8-Watt Audio Power Amplifier described in *RCA Linear Integrated Circuit*, SSD-240A, RCA Solid State, Nov. 1978, at page 314-16 and incorporated herein by reference for the purpose of showing one such amplifier. Amplifier 10 receives relatively positive and negative operating potentials from terminals 16 and 18, respectively.

Because the magnitude of the output current which amplifier 10 can supply is limited, as indicated by resistor RS, that output current can be insufficient to directly supply base current to output transistor T0. Drive circuit 20 amplifies current from amplifier 10 received at node 22 and supplies base-drive current to transistor T0 from node 24 and is similar to that of the RCA CA2002 Integrated Circuit referred to above and incorporated herein by reference. Current received at node 22 is amplified by NPN transistor T10, the collector current of which is further amplified and inverted by a current mirror amplifier (CMA) including diode-connected PNP master transistor T12 and PNP slave transistor T14. Collector current from T14 flows via node 24 as base current for T0.

Diode-connected NPN transistor T16 connects to node 24 so to serve as a master transistor of a CMA with T0 serving as the slave transistor thereof, when relatively small magnitudes of load current are demanded. As a result, the overall current gain between node 22 and output 26 can be readily controlled at relatively small magnitudes of load current demand. The emitters of T10 and T16 connect together and thence to output terminal 26 through resistor R10. When relatively higher levels of load current are demanded from T0, the current in T10 will be higher causing the voltage drop across resistor R10 to be of increased magnitude. As a result, the base-emitter voltage of T16 is decreased so that it will conduct a relatively lower current causing substantially all the collector current of T14 to flow as base current to transistor T0. In that manner, greater current gain and higher drive current efficiency is obtained from drive circuit 20 at relatively higher levels of current demand.

Protection circuit 30 serves to protect transistor T0 during periods of high current demand from currents of magnitude sufficient to cause damage to, or degradation of, T0. PNP transistor T1 has its base connected to the emitter of T0 without substantial intervening impedance through which collector-emitter current of T0 flows and has its emitter connected to the base of T0. Transistors T1 and T0 are thermally coupled for tracking their respective operating temperatures as indicated by undulating arrow 34. In practice, thermal coupling can be accomplished by fabricating T1 and T0 on the same integrated circuit substrate or, for discrete circuits, by mounting them on a shared thermal structure such as a heat sink. The effective base-emitter junction areas of transistors T1 and T0 are in 1:m ratio, where m is a number preferably greater than unity, as indicated by the encircled characters proximate to their respective emitters. Because transistors T0 and T1 operate at equal base-emitter potentials, their respective collector-emitter currents are substantially in 1:m ratio. Therefore, the collector-emitter current of T0 is indirectly sensed by T1, the collector current of which is approximately 1/m that of T0.

The collector current of T1 is applied to resistor R3 connected in parallel with diode-connected PNP transistor T3 to develop a potential at node 32 having a magnitude related to the collector-emitter current of T0. When the potential at node 32 exceeds the threshold voltage level of the base-emitter junction of NPN transistor T2 to which it is applied, collector current will flow in T2. Transistor T2 thus serves as a comparator providing a current at its output which is an indication of overcurrent condition in the protected transistor T0 whenever the collector current of T1 exceeds a predetermined threshold level. The overcurrent condition indication of the collector current of T2 is withdrawn from node 22 to prevent further increase in the base-current to T10 which thereby prevents further increase in the base-current applied to protected transistor T0 by drive circuit 20.

A further feature of the present invention is provided for reducing the value of collector-emitter current to which T0 is limited as its collector-emitter potential increases. In this manner, a protection characteristic for T0 current as a function of its collector-emitter voltage is provided that approximates its safe operating area region (SOAR). SOAR ratings are described in RCA, *Designer's Handbook, SOLID-STATE POWER CIRCUITS,* Technical Series SP-52, 1971, pp. 134–43, hereby incorporated herein by reference. A voltage divider including resistors R1 and R2 serially connected between output terminal 26 and node 18 generates a potential at node 36 that is related to the collector-emitter potential of T0. When the collector-emitter potential of T0 increases, the potential between terminals 26 and 18 decreases in complementary fashion as does the potential across resistor R2. That decrease in the potential at node 36 at the emitter of T2 appears as an increase in the base-emitter potential of comparator transistor T2 so that it will become conductive for lower values of potential at node 32. In other words, the potential applied to the base-emitter of T2 is equal to the potential at node 32 (responsive to the collector-emitter current flow in T0) decreased by the potential at node 36 (responsive in complementary fashion to the collector-emitter potential of T0). It is understood that the portion of the collector-emitter current of T0 that flows through R1 is preferably small as compared to the portion flowing through load 40.

Protection circuit 30 is arranged so that the effects of differences between the base-emitter voltage to collector-emitter current conversion relationship of transistor T0 and that of T1 are beneficially minimized. Such differences can occur, for example, in an integrated circuit wherein T0 is a vertical-geometric-structure NPN transistor and T1 is a lateral geometric-structure PNP transistor. When T1 and T3 are of like geometric structure, e.g., both are lateral PNP geometric-structure transistors, any voltage-to-current conversion errors introduced by T1 being different from T0 are substantially eliminated by the current-to-voltage conversion characteristic of T3 being like that of T1. As a result, the potential at node 32 substantially represents the base-emitter potential and, therefore, the collector-emitter current of T0.

Modifications to the above described embodiment are contemplated to be within the scope of the invention as defined by the claims following. While a preferred embodiment has been described, certain elements could be omitted and satisfactory, albeit different, performance characteristics would obtain. For example, if T3 were to be omitted, the threshold level of overcurrent protection would decrease with increasing operating temperature owing to the decrease in base-emitter threshold potential of T2 with increased operating temperature. Further, if R3 were to be omitted but T3 retained, a substantially temperature independent current limit threshold would obtain. As described, protection circuit 30 exhibits a slightly negative temperature coefficient of overcurrent threshold value.

It is also contemplated that transistor T0, T1, T2 and T3 could be replaced by field-effect transistors (FET) with N-channel FETS replacing NPN transistors and with P-channel FETS replacing PNP transistors. The width-to-length ratio (W/L) of a FET is the functional equivalent of the base-emitter junction area of a bipolar transistor referred to above. The respective W/L ratios of two FETs can be selected to obtain drain-source currents in ratio of 1/m when equal gate-source voltages are applied.

The present invention is also applicable when a complementary, push-pull amplifier, for example, of the sort suggested by the RCA *Designers' Handbook,* referred to above, at FIGS. 675 and 677, is desired. In that case, a transistor complementary to T0 can be connected between output terminal 26 and supply terminal 18. An additional drive circuit 20 and an additional protection circuit 30 therefor would have the conductivities of their respective transistors interchanged NPN for PNP, and PNP for NPN, and would have their connections to supply terminals 16 and 18 reversed.

The amplifier of the FIGURE can be employed in a degenerative feedback amplifier configuration by the inclusion of direct-coupled feedback, such as a resistor (not shown), from output terminal 26 to inverting input terminal 14.

What is claimed is:

1. In an electronic circuit including a protected transistor of first conductivity type having base and emitter electrodes and a base-emitter junction therebetween, and having a collector electrode, means for applying a base drive current to the base electrode of said protected transistor, and means for coupling the collector-emitter current path of said protected transistor to a source of collector-emitter potential and to a load, an overcurrent protection circuit for said protected transistor comprising:

a first transistor of second conductivity type complementary to said first conductivity type, having base and emitter electrodes respectively connected to the emitter and base electrodes of said protected transistor without substantial intervening impedance through which collector-emitter current of said protected transistor flows, having a collector electrode, and having said protected transistor thermally coupled therewith for tracking the operating temperature of said first transistor to that of said protected transistor;

comparator means to which the collector electrode of said first transistor connects for providing an indication of an overcurrent condition of said protected transistor whenever collector current of said first transistor exceeds a predetermined level; and means responsive to said overcurrent indication for preventing further increase in said base drive current to said protected transistor.

2. The protection circuit of claim 1 wherein said comparator means comprises:
   a second transistor having a base electrode, having an emitter electrode connected to a node, and having a collector electrode for supplying a current serving as said overcurrent indication; and
   current to voltage converting means for applying a first voltage responsive to the collector current of said first transistor between the base electrode of said second transistor and said node.

3. The protection circuit of claim 2 wherein said current to voltage converting means includes: a resistance connected between the base electrode of said second transistor and said node, and means for applying the collector current of said first transistor to said resistance to develop said first voltage.

4. The protection circuit of claim 2 wherein said current to voltage converting means includes: a semiconductor junction having first and second electrodes respectively connected to the base electrode of said second transistor and to said node, and means for applying the collector current of said first transistor to said semiconductor junction to develop said first voltage.

5. The protection circuit of claim 4 wherein said semiconductor junction includes a third transistor of said second conductivity type, having base and collector electrodes connected in common to serve as said second electrode, and having an emitter electrode serving as said first electrode.

6. The protection circuit of claim 5 wherein said first and third transistors are of like geometric construction on an integrated circuit.

7. The protection circuit of claim 2, 3, 4 or 5 wherein said second transistor is of said first conductivity type.

8. The protection circuit of claim 7 further including:
   voltage dividing means for developing a second voltage related to the collector-emitter potential of said protected transistor; and
   means for applying said second voltage to the base-emitter junction of said second transistor to reduce the potential thereacross.

9. The protection circuit of claim 8 wherein said voltage dividing means and said means for applying said second voltage together comprise: a first resistance interposed between the emitter electrode of said second transistor and said node, and a second resistance connected between the emitter electrode of said second transistor and one of the collector and emitter electrodes of said protected transistor.

10. The protection circuit of claim 1 wherein the base-emitter junction of said first transistor has an area that is smaller than that of said protected transistor.

11. In an electronic circuit including a protected transistor of first conductivity type having input and common electrodes and an input-common junction therebetween, and having an output electrode, means for applying an input drive signal to the input electrode of said protected transistor, and means for coupling the output-common current path of said protected transistor to a source of output-common potential and to a load, an overcurrent protection circuit for said protected transistor comprising:
   a first transistor of second conductivity type complementary to said first conductivity type, having input and common electrodes respectively connected to the common and input electrodes of said protected transistor without substantial intervening impedance through which output-common current of said protected transistor flows, having an output electrode, and having said protected transistor thermally coupled therewith for tracking the operating temperature of said first transistor to that of said protected transistor;
   comparator means to which the collector electrode of said first transistor connects for providing an indication of an overcurrent condition of said protected transistor whenever output electrode current of said first transistor exceeds a predetermined level; and
   means responsive to said overcurrent indication for preventing further increase in said input drive signal to said protected transistor.

12. The protection circuit of claim 11 wherein said comparator means comprises:
   a second transistor having an input electrode, having a common electrode connected to a node, and having an output electrode for supplying a current serving as said overcurrent indication; and
   current to voltage converting means for applying a first voltage responsive to the output electrode current of said first transistor between the input electrode of said second transistor and said node.

13. The protection circuit of claim 12 wherein said current to voltage converting means includes: a resistance connected between the input electrode of said second transistor and said node, and means for applying the output electrode current of said first transistor to said resistance to develop said first voltage.

14. The protection circuit of claim 12 wherein said current to voltage converting means includes: a semiconductor junction having first and second electrodes respectively connected to the input electrode of said second transistor and to said node, and means for applying the output electrode current of said first transistor to said semiconductor junction to develop said first voltage.

15. The protection circuit of claim 14 wherein said semiconductor junction includes a third transistor of said second conductivity type, having input and output electrodes connected in common to serve as said second electrode, and having a common electrode serving as said first electrode.

16. The protection circuit of claim 15 wherein said first and third transistors are of like geometric construction on an integrated circuit.

17. The protection circuit of claim 12, 13, 14 or 15 wherein said second transistor is of said first conductivity type.

18. The protection circuit of claim 17 further including:
   voltage dividing means for developing a second voltage related to the output-common potential of said protected transistor; and
   means for applying said second voltage to the input-common junction of said second transistor to reduce the potential thereacross.

19. The protection circuit of claim 18 wherein said voltage dividing means and said means for applying said second voltage together comprise: a first resistance interposed between the common electrode of said second transistor and said node, and a second resistance connected between the common electrode of said second transistor and one of the output and common electrodes of said protected transistor.

20. The protection circuit of claim 11 wherein the input-common junction of said first transistor has an effective area that is smaller than that of said protected transistor.

* * * * *